United States Patent
Muhlbauer et al.

(10) Patent No.: US 6,393,262 B1
(45) Date of Patent: May 21, 2002

(54) DIFFERENCE FREQUENCY IMPEDANCE TRANSFORMATION CIRCUITS AND METHODS FOR PROVIDING SAME IN POWER AMPLIFIER SYSTEMS

(75) Inventors: Teresa Anne Muhlbauer; Ronald Oliver, both of Cary, NC (US)

(73) Assignee: Ericsson Inc., Reseach Triangle Park, NC (US)

( * ) Notice: Subject to any disclaimer, the term of this patent is extended or adjusted under 35 U.S.C. 154(b) by 0 days.

(21) Appl. No.: 09/480,960

(22) Filed: Jan. 11, 2000

(51) Int. Cl.[7] .............................................. H01Q 11/12
(52) U.S. Cl. ...................... 455/127; 455/107; 333/124; 333/17.3
(58) Field of Search ................................ 455/127, 107, 455/553; 33/17.3, 32, 124

(56) References Cited

U.S. PATENT DOCUMENTS

| | | | | |
|---|---|---|---|---|
| 5,278,996 A | * | 1/1994 | Shitara | 455/127 |
| 5,423,074 A | * | 6/1995 | Dent | 455/74 |
| 5,697,074 A | * | 12/1997 | Makikallio et al. | 455/126 |
| 5,778,308 A | * | 7/1998 | Sroka et al. | 455/115 |
| 5,809,420 A | * | 9/1998 | Ichiyanagi et al. | 455/103 |

FOREIGN PATENT DOCUMENTS

EP 0779707 A1 6/1997

\* cited by examiner

*Primary Examiner*—Daniel Hunter
*Assistant Examiner*—Lana Le
(74) *Attorney, Agent, or Firm*—Myers Bigel Sibley & Sajovec

(57) ABSTRACT

Difference frequency impedance transformation circuits for power amplifiers can change the impedance presented to an input of a power amplifier at a frequency that is a function of a difference between the receive and transmit frequency ranges. The difference frequency impedance transformation circuit may, therefore, reduce the noise at the difference frequency which may otherwise be mixed with the transmit frequencies to produce noise in the receive frequency range. In particular, difference frequency impedance transformation circuits can include a first circuit that conducts the first signals to an input of the power amplifier. A second circuit is electrically coupled to the input of the power amplifier and changes the impedance presented to the input of the power amplifier at the difference frequency. Related power amplifier systems, wireless user terminals, and methods are also disclosed.

40 Claims, 7 Drawing Sheets

DIFFERENCE FREQUENCY IMPEDANCE TRANSFORMATION CIRCUITS AND METHODS FOR PROVIDING SAME IN POWER AMPLIFIER SYSTEMS

FIELD OF THE INVENTION

The present invention relates to the field of amplifiers in general, and more particularly, to power amplifiers in wireless user terminals.

BACKGROUND OF THE INVENTION

Radiotelephones that operate in wireless communication systems, such as CDMA IS-95 or AMPS IS-19, may use a Power Amplifier (PA) to amplify signals transmitted to the communications system via a radiotelephone antenna. The radiotelephone may also receive signals via the antenna from the system which are provided to a receiver therein.

Some radiotelephones include a duplexer that can enable the radiotelephone to use the same antenna for the transmission and reception of the respective signals. For example, signals generated by a transmitter and amplified by the PA can be transmitted via the antenna through the duplexer and signals received via the antenna can be provided to the receiver through the duplexer. Unfortunately, noise in the signals generated by the PA may be coupled to the received signals in the duplexer. The received signals, including the noise generated by the PA, may then be provided to the receiver which can result in a reduction in the sensitivity of the receiver.

Some conventional radiotelephones reduce noise included in the signals provided to the receiver by using a PA having a low-noise specification for receive band frequencies. Consequently, some PAs which do not meet the requisite noise performance criteria, but have other desirable characteristics may be excluded from use. Accordingly, there is a need, for example, to further improve noise performance of radiotelephones.

SUMMARY OF THE INVENTION

It is, therefore, an object of the present invention to allow improved user terminals that operate within a wireless communications system.

It is another object of the present invention to allow improved noise performance of user terminals that operate within a wireless communications system.

These, and other objects of the present invention, may be achieved by a difference frequency impedance transformation circuit that changes an impedance presented to an input of a power amplifier at a difference frequency that is a function of a difference between receive and transmit frequency ranges. In particular, a difference frequency impedance transformation circuit can include a first circuit that conducts the first signals to an input of the power amplifier, and a second circuit that changes the impedance presented to the input of the power amplifier at the difference frequency, where the difference frequency is a function of a difference between the receive frequency range and the transmit frequency range. According to the present invention, reducing noise at out-of-band frequencies may result in reduced noise coupled to received signals in the duplexer and passed to the receiver. This may allow some power amplifier devices with lesser noise performance to be used while reducing the noise which may otherwise be coupled to the receiver. In contrast, in conventional systems the difference frequency may be mixed with the transmit frequencies to produce noise in the receive frequency range.

According to one embodiment, the difference frequency impedance transformation circuit provides an impedance to the input of the power amplifier at the difference frequency that is greater than the impedance provided to frequencies in the transmit range. In another embodiment according to the present invention, the impedance provided to the input of the power amplifier at the difference frequency is less than the impedance provided to frequencies in the transmit range.

In one embodiment according to present invention using AMPS-19, the transmit frequency range is about 824 MHz to 849 MHz, the receive frequency range is about 869 MHz to 894 MHz, and the difference frequency is about 45 MHz. In an embodiment according to the present invention using CDMA IS-95, the transmit frequency range is about 1850 MHz to 1910 MHz, the receive frequency range is about 1930 MHz to 1990 MHz, and the difference frequency is about 80 MHz.

According to a further aspect of the present invention, a power amplifier device includes a first power amplifier stage having a first input thereto and a first output and a second power amplifier stage having a second input that is electrically coupled to the first output, where the first signal is electrically coupled to the second input.

A difference frequency impedance transformation circuit changes the impedance presented to the input of the second stage at frequencies that are a function of the difference between the receive frequency range and the transmit frequency range. In particular, if noise is present at the output of the first stage, the second out-of-band circuit can change the impedance for frequencies about equal to the difference between the receive and transmit frequency ranges. Furthermore, the present invention may be practiced using a power amplifier device that includes more than two stages. For example, in a further embodiment, a third out-of-band circuit can be electrically coupled to input of a third stage in the power amplifier device.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

As will be appreciated by one of skill in the art, the present invention may be embodied as methods or devices. Accordingly, the present invention may take the form of an entirely hardware embodiment, an entirely software embodiment or an embodiment combining software and hardware aspects. Although the present invention is described herein by reference to a radiotelephone, it will be understood that the present invention may be practiced with any user terminal that operates within a wireless communications system. As used herein, the term "noise" includes signals having undesirable components such as thermal noise, shot noise, flicker noise or spurious signals.

Figure 1:
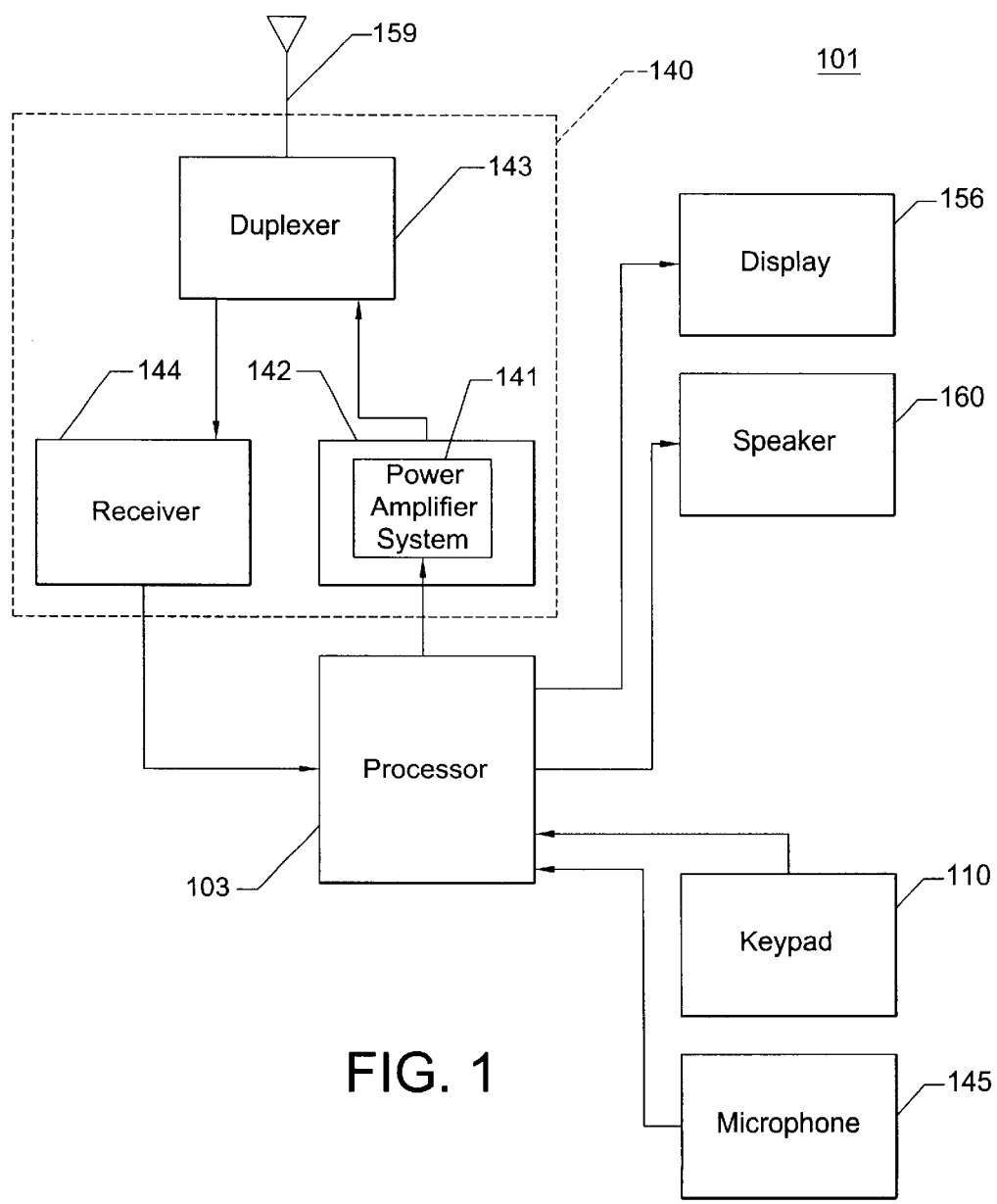
FIG. 1 is a block diagram that illustrates an embodiment of a radiotelephone according to the present invention.

FIG. 1 is a block diagram of an embodiment of a radiotelephone 101 according to the present invention. The radiotelephone 101 can be used to communicate within a wireless communications system.

Wireless communications systems are commonly employed to provide voice and data communications to subscribers. For example, analog cellular radiotelephone systems, such as those designated AMPS, ETACS, NMT-450, and NMT-900, have long been deployed successfully throughout the world. Digital cellular radiotelephone systems, such as those conforming to the North American standard IS-54 and the European standard GSM, have been in service since the early 1990's. More recently, a wide variety of wireless digital services broadly labeled as PCS (Personal Communications Services) have been introduced, including advanced digital cellular systems conforming to standards such as IS-136 and IS-95, lower-power systems such as DECT (Digital Enhanced Cordless Telephone) and data communications services such as CDPD (Cellular Digital Packet Data).

As shown in FIG. 1, the radiotelephone 101 includes a keypad 110 which can be used to provide input to the radiotelephone 101. The keypad 110 can include a plurality of keys that provide input to the radiotelephone 101 when pushed. For example, when the user wishes to initiate a call in the communications system, the user may push a series of keys that correspond to the number to be dialed. During the call, the user can speak into a microphone 145 which causes the radiotelephone 101 to generate communication signals which are transmitted from the radiotelephone 101. The user may listen to a speaker 160 that produces audio signals generated by the radiotelephone 101 from communication signals received by the radiotelephone 101 during a call. The radiotelephone 101 transmits and receives the communication signals via a transceiver 140 over an antenna 159.

During operation, the user may refer to a display 156 of the radiotelephone 101 to observe information relevant to the operation of the radiotelephone 101, such as characters or numbers. For example, the display 156 can be a black and white Liquid Crystal Display (LCD) that displays for example, a telephone number entered by the user or a name stored in the radiotelephone 101. The display 156 may also be used in conjunction with the keypad 110 such as when the user dials a number to place a call.

A processor 103 provides the communications signals to the transceiver 140 for transmission and receives the communications signals from the transceiver for reception. For example, the processor 103 provides communications signals to the transceiver 140 when the user speaks into the microphone 145 and receives communications signals from the transceiver 140 for the reproduction of audio through the speaker 160. The processor 103 can generate characters for display on the display 156. For example, the processor 103 can generate numbers for display when the user enters a telephone number on the keypad 110. The characters can also be generated by a character generator which is not shown. The microphone 145, speaker 160, keypad 110, and display 156 are coupled to the processor 103 which controls operations of the radiotelephone 101.

Figure 2:
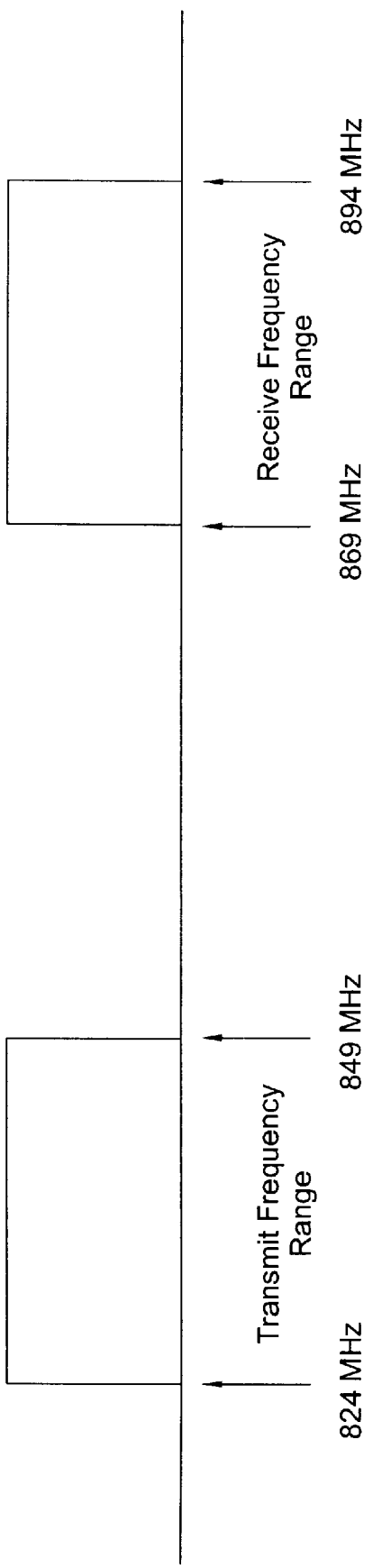
FIG. 2 is a graph of transmit and receive frequencies used by a radiotelephone to communicate within a wireless communications system.

The transceiver 140 includes a transmitter 142 that includes a power amplifier system 141 that amplifies the transmit signals for transmission from the radiotelephone 101 through a duplexer 143 via the antenna 159 at a transmit frequency in a transmit frequency range. The duplexer 143 also provides communications signals received via the antenna 159 at a receive frequency in a receive frequency range to a receiver 144 which communicates with the processor 103. For example, in AMPS IS-19, the transmit frequency range is about 824 MHz to 849 MHz and the receive frequency range is about 869 MHz to 894 MHz as shown in FIG. 2. It will be understood that the transceiver 140 can include other components included in conventional transceivers which are not shown herein.

The duplexer 143 can include, for example, respective transmit and receive bandpass filters. The transmit bandpass filter can allow signals having a frequency in the transmit frequency range to be passed to the antenna 159 for transmission. The receive bandpass filter may allow signals having a frequency in the receive frequency range to be passed from the antenna 159 to the receiver 144. For example, in AMPS IS-19, the transmit bandpass filter passes signals having a frequency between about 824 MHz and 849 MHz (the transmit frequency range) to the antenna 159 for transmission and the receive bandpass filter passes signals having a frequency between about 869 MHz and 894 MHz from the antenna 159 to the receiver 144.

Due to imperfections in the duplexer 143, some frequencies in the signals from the power amplifier system 141 passed to the antenna 159 may be coupled to the signals passed to the receiver 144. For example, if the power amplifier system 141 mixes noise having a frequency that is outside the transmit frequency range (out-of-band) with the signals in the transmit frequency range (in-band), the resulting mixed signals may include a frequency of that is about equal to the sum of the out-of-band frequency and the in-band frequency. Mixing may occur in the power amplifier, for example, if the power amplifier is operated in a non-linear mode.

The noise can be generated by the power amplifier system 141 or other components in the radiotelephone 101. Noise generated by the power amplifier system may be due to the type of components used in the power amplifier system 141. For example, Gallium Arsenide Heterojunction Bipolar Transistors (HBT) may send more noise than other types of technologies (such as GaAs MESFETs).

Moreover, if the out-of-band frequency is about equal to the difference between transmit and receive frequency ranges (i.e., the difference frequency $\Delta f$), some of the signals provided to the duplexer 143 by the power amplifier system 141 may be in the receive frequency range which, as described above, may be coupled through the duplexer 143 to the signals received from the antenna 159 and provided to the receiver 144. Accordingly, the receiver 144 could receive undesirable signals from the power amplifier system 141 through the duplexer 143. For example, in AMPS IS-19, the difference frequency is about 45 MHz. Therefore, if the PA mixes a 45 MHz frequency with the transmit signals in the transmit frequency range, the resulting signal may include frequencies in the receive frequency range.

Figure 3:
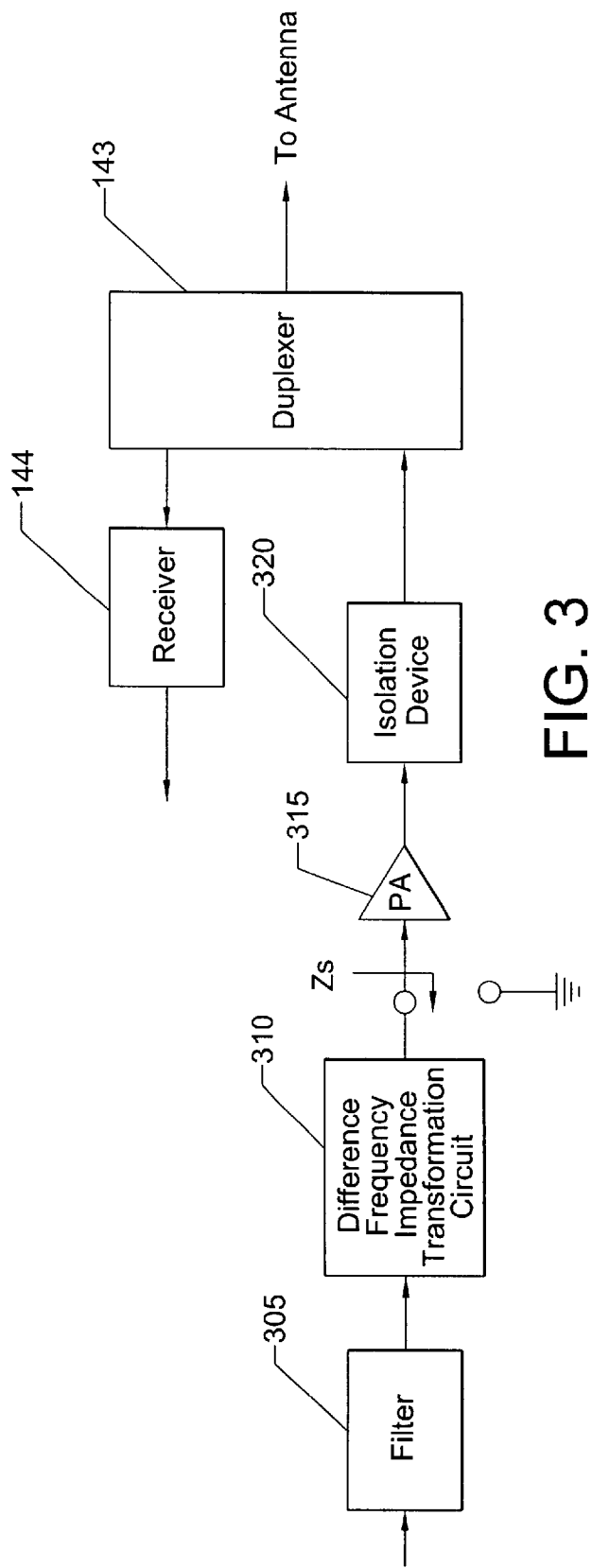
FIG. 3 is a block diagram that illustrates an embodiment of a portion of a transceiver according to the present invention.

FIG. 3 is a block diagram of an embodiment of part of a transceiver 140 according to the present invention. According to FIG. 3, a bandpass filter 305 passes transmit signals in the transmit frequency range to an input of a Power Amplifier (PA) device 315 through a difference frequency impedance transformation circuit 310. The PA device 315 amplifies the transmit signals passed by the bandpass filter 305 through the difference frequency impedance transformation circuit 310 to provide amplified transmit signals to the duplexer 143 through an isolation device 320. The isolation device 320 can reduce the amount of power reflected back to the PA device 315 which, otherwise, could damage the PA device 315.

According to the present invention, the difference frequency impedance transformation circuit 310 can change the impedance, Zs, presented to the input of the power amplifier device 315 at a frequency that is a function of a difference between the receive frequency range and the transmit frequency range (i.e., the difference frequency Δf). For example, in AMPS IS-19, the difference between the receive and transmit frequency ranges is about 45 MHz. The difference frequency impedance transformation circuit 310, therefore, changes the impedance presented to the input of the PA device 315 at about 45 MHz (i.e., the difference frequency Δf). As used herein, the term "impedance" refers to a magnitude of a complex impedance.

The present invention may, thereby, reduce the noise at the difference frequency that may otherwise be mixed with the in-band frequencies to produce noise in the receive frequency range. Accordingly, the present invention may allow some power amplifier devices, such as those using a GaAs HBT, to be used while reducing the noise which may otherwise be coupled to the receiver.

In one embodiment, for example, the impedance provided to the input of the PA device 315 at the difference frequency is greater than the impedance provided to frequencies in the transmit range. For example, the impedance presented to the input of the PA device 315 at the transmit frequency range can be about 50 ohms and the impedance presented to the input of the PA device 315 at the difference frequency can be changed to about 100 ohms. In other words, the impedance presented to the input of the PA device 315 at the difference frequency can be greater than 50 ohms, but less than the impedance that would be presented to the input of the PA device 315 in the absence of the difference frequency impedance transformation circuit 310.

In another embodiment according to the present invention, the impedance provided to the input of the PA device 315 at the difference frequency is less than the impedance provided to frequencies in the transmit range. For example, the impedance presented to the input of the PA device 315 at the transmit frequencies can be about 50 ohms and the impedance presented to the input of the PA device 315 at the difference frequency is changed to a few ohms. For example, if noise is present at the input of the PA device 315, the difference frequency impedance transformation circuit 310 can change the impedance, Zs, to provide a relatively low impedance path to a reference voltage level, $V_0$, such as ground or another reference voltage, at a frequency about equal to the difference between the receive and transmit frequency ranges.

In contrast to the present invention, conventional power amplifier systems may present an input of a power amplifier with an impedance that is equivalent to an open circuit at the difference frequency. For example, in a conventional power amplifier system, the impedance presented to the input of the PA at the difference frequency may be the output impedance of the bandpass filter (essentially an open circuit). Therefore, a conventional system may not provide an impedance through which the noise at the difference frequency may be reduced.

Figure 4:
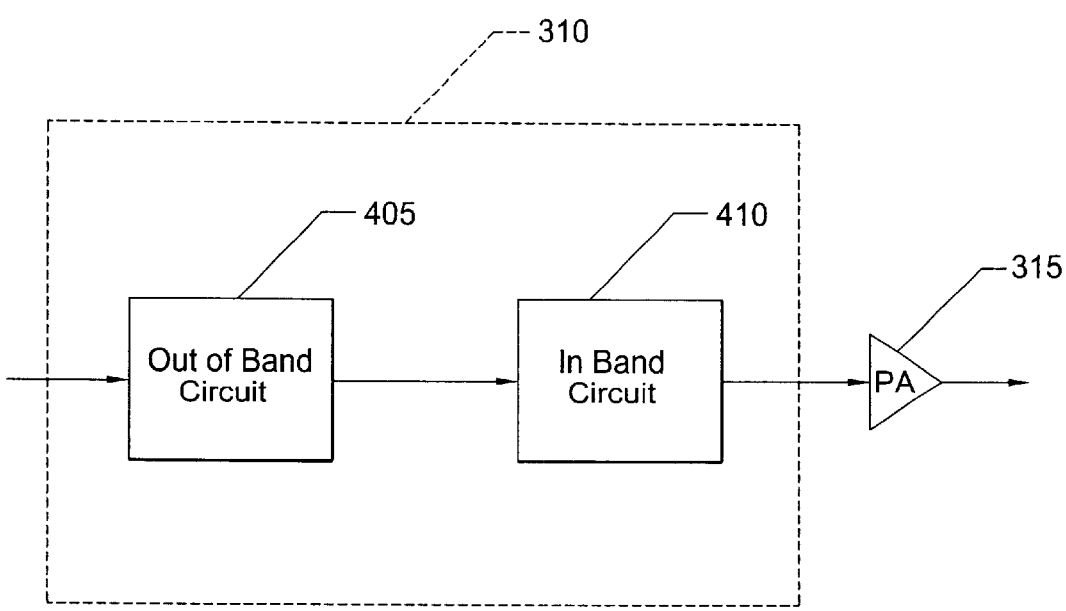
FIG. 4 is a block diagram that illustrates an embodiment of the difference frequency transformation circuit shown in FIG. 3.

FIG. 4 is a block diagram of an embodiment of the difference frequency impedance transformation circuit 310 shown in FIG. 3. According to FIG. 4, the difference frequency impedance transformation circuit 310 includes an out-of-band impedance circuit 405 and an in-band circuit 410 electrically coupled to the PA device 315. The out-of-band circuit 405 changes the impedance presented to the PA device 315 at a frequency that is a function of the difference between the receive frequency range and the transmit frequency range. The in-band circuit 410 can provide adequate power transfer of the transmit signals from the bandpass filter 305 to the PA device 315. In one embodiment, the in-band circuit 410 provides an impedance of 50 ohms to the transmit signals passed by the bandpass filter 305.

Figure 5A:
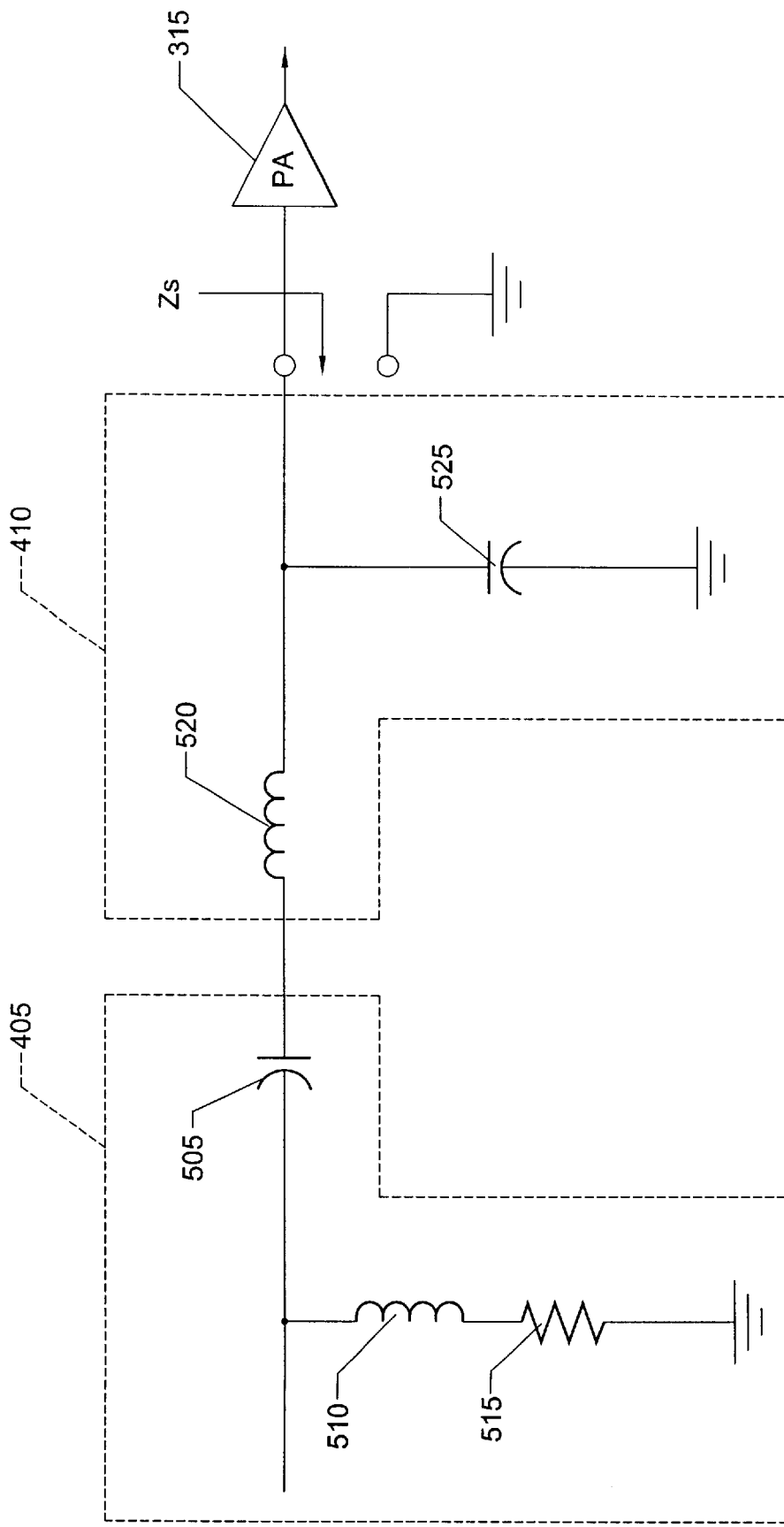
FIG. 5A is a circuit schematic diagram of an embodiment of the out-of-band circuit and the in-band circuit included in the difference frequency transformation circuit shown in FIG. 4.

FIG. 5A is a schematic circuit diagram of an embodiment of the out-of-band circuit 405 and the in-band circuit 410 shown in FIG. 4. As shown in FIG. 5A, the out-of-band circuit 405 can include a first inductor 510 electrically coupled in series with a resistor 515. A Direct Current (DC) blocking capacitor 505 can be electrically coupled in series between the first inductor 510 and the input of the PA device 315. The DC blocking capacitor 505 can reduce the effect of the impedance of the series combination the first inductor 510 and the resistor 515 on the internal biasing of the PA device 315. The in-band circuit 410 can include a combination of a second inductor 520 and a capacitor 525 electrically coupled to the PA device 315 as shown in FIG. 5A.

It will be understood that the in-band circuit 410 or the out-of-band circuit 405 can be directly coupled to the input of the PA device 410, however, if the in-band circuit 410 is directly coupled to the input of the PA device 315, as shown in FIG. 5A, the in-band circuit 410 preferably functions as a low-pass filter so that the out-of-band circuit 405 can change the impedance presented to the input of the PA device 315 at the difference frequency. According to an exemplary embodiment of the present invention as shown in FIG. 5A, the first inductor 510 has a value of about 22 nanohenries, the resistor 515 has a value of about 39 ohms, and the DC blocking capacitor 505 has a value of about 100 picofarads.

Figure 5B:
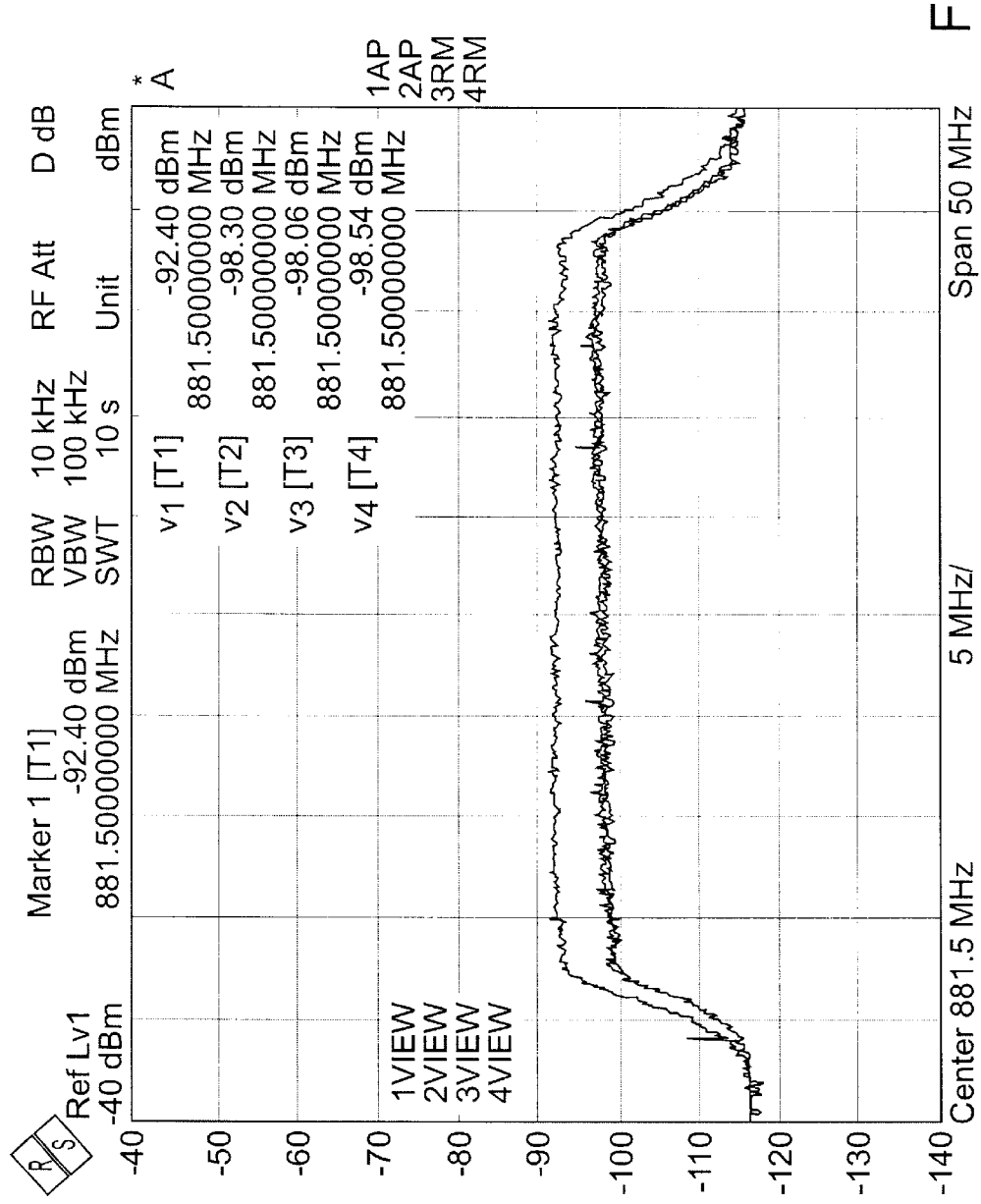
FIG. 5B is a graph that illustrates comparative measurements of noise performance of a power amplifier system.

FIG. 5B is a graph that illustrates comparative measurements of noise performance of a PA system using the exemplary values of the components described with respect to FIG. 5A According to FIG. 5B, trace V1 is measured noise performance of the PA system without an out-of-band circuit and trace V2 is measured noise performance of the PA system with an out-of-band circuit 405 according to the present invention. In particular, the noise performance of the PA system with the out-of-band circuit 405 is improved by about 6 dB compared to the measured noise performance of the PA system without the out-of-band circuit.

Figure 6:
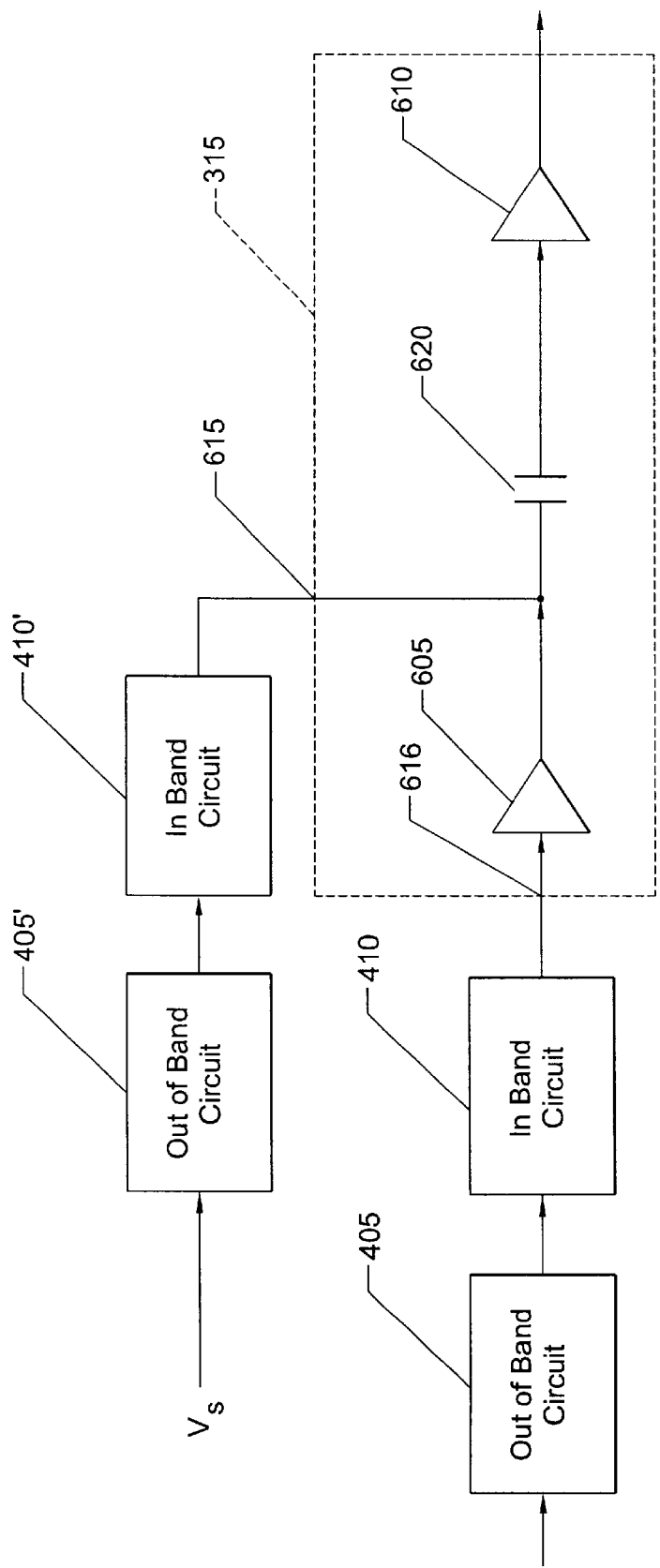
FIG. 6 is a block diagram that illustrates a second embodiment of a power amplifier system according to the present invention.

FIG. 6 is a block diagram that illustrates a second embodiment of a power amplifier system according to the present invention. According to FIG. 6, a first out-of-band circuit 405 and a first in-band circuit 410 are electrically coupled to a first stage 605 of the PA device 315 via a first input 616.

A second out-of-band circuit 405' and a second in-band circuit 410' are electrically coupled to a second stage 610 of the PA device 315 through a second DC blocking capacitor 620 via a second input 615 to the PA device 315.

The second out-of-band circuit 405' changes the impedance presented to the second input 615 at frequencies that are a function of the difference between the receive frequency range and the transmit frequency range at the output of the first stage 605. In one embodiment, for example, if noise is present at the output of the first stage 605, the second out-of-band circuit 405' can provide a relatively low impedance path to a reference voltage level, $V_o$, at a frequency about equal to the difference between the receive and transmit frequency ranges. The second in-band circuit 410' provides adequate impedance matching between the output impedance of the first stage 605 and the input impedance of the second stage 610. Furthermore, the present invention may be practiced using a PA device 315 that includes more than two stages. For example, a third out-of-band circuit can be electrically coupled to an input of a third stage in the PA device 315.

Therefore, according to the present invention, a difference frequency impedance transformation circuit can change the impedance presented to the input of a PA device at a frequency that is a function of a difference between the receive and transmit frequency ranges. Accordingly, the present invention may reduce noise at difference frequencies which may otherwise be mixed with the in-band frequencies to produce noise in the receive frequency range that may reduce the sensitivity of the receiver.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A difference frequency impedance transformation circuit for a power amplifier in a user terminal, the power amplifier amplifying first signals for transmission from the user terminal in a first frequency range and the user terminal receiving second signals in a second frequency range, the circuit comprising:
    a first circuit that conducts the first signals to an input of the power amplifier; and
    a second circuit, electrically coupled to the input of the power amplifier, that changes an impedance presented to the input of the power amplifier at a third frequency that is a function of a difference between the second frequency range and the first frequency range.

2. The circuit of claim 1, wherein the second circuit provides the impedance to the input of the power amplifier at the third frequency that is less than a second impedance presented to the input of the power amplifier at the first frequency range.

3. The circuit of claim 1, wherein the second circuit provides the impedance to the input of the power amplifier at the third frequency that is greater than a second impedance presented to the input of the power amplifier at the first frequency range.

4. The circuit of claim 1, wherein the first frequency range is about 824 MHz to 849 MHz and the second frequency range is about 869 MHz to 894 MHz.

5. The circuit of claim 1, wherein the third frequency is about 45 MHz.

6. The circuit of claim 1, wherein the third frequency is generated by the power amplifier.

7. The circuit of claim 1, wherein the second circuit comprises:
    an inductor electrically coupled to the first circuit; and
    a resistor electrically coupled in series with the inductor to the reference voltage level.

8. The circuit of claim 7 further comprising:
    a capacitor electrically coupled in series between the input of the power amplifier and the inductor.

9. The circuit of claim 1, wherein the first circuit comprises an in-band matching circuit.

10. The circuit of claim 1, wherein the in-band matching circuit comprises an inductor in combination with a capacitor.

11. The circuit of claim 1, wherein the power amplifier includes:
    a first power amplifier stage having a first input thereto and a first output therefrom; and
    a second power amplifier stage having a second input thereto that is electrically coupled to the first output, wherein the first signal is electrically coupled to the second input.

12. A power amplifier device for a user terminal, the power amplifier device amplifying first signals for transmission from the user terminal in a first frequency range and the user terminal receiving second signals in a second frequency range, the power amplifier device comprising:
    a power amplifier circuit having an input thereto;
    a first circuit that conducts the first signals to the input of the power amplifier circuit; and
    a second circuit, electrically coupled to the input of the power amplifier circuit, that changes an impedance presented to the input of the power amplifier device at a third frequency that is a function of a difference between the second frequency range and the first frequency range.

13. The power amplifier device of claim 12, wherein the second circuit provides the impedance to the input of the power amplifier device at the third frequency that is less than a second impedance presented to the input of the power amplifier at the first frequency range.

14. The power amplifier device of claim 12, wherein the second circuit provides the impedance to the input of the power amplifier device at the third frequency that is greater than a second impedance presented to the input of the power amplifier at the first frequency range.

15. The power amplifier device of claim 12, wherein the first circuit comprises an in-band matching circuit.

16. The power amplifier device of claim 12, wherein the power amplifier circuit includes:
    a first power amplifier stage having a first input thereto and a first output therefrom; and
    a second power amplifier stage having a second input thereto that is electrically coupled to the first output, wherein the first signal is electrically coupled to the second input.

17. The power amplifier device of claim 12, wherein the first frequency range is about 824 MHz to 849 MHz and the second frequency range is about 869 MHz to 894 MHz.

18. The power amplifier device of claim 12, wherein the third frequency is about 45 MHz.

19. The power amplifier device of claim 12, wherein the third frequency is generated by the power amplifier circuit.

20. A wireless user terminal comprising:
    a transmitter that transmits first signals in a first frequency range from the wireless user terminal;

a receiver that receives second signals in a second frequency range at the wireless user terminal;

a power amplifier that amplifies the first signals provided at an input thereto;

a first circuit that conducts the first signals to the input of the power amplifier; and a second circuit, electrically coupled to the input of the power amplifier, that changes an impedance presented to the input of the power amplifier at a third frequency that is a function of a difference between the second frequency range and the first frequency range.

21. The user terminal of claim 20, wherein the second circuit provides the impedance to the input of the power amplifier at the third frequency that is less than a second impedance presented to the input of the power amplifier at the first frequency range.

22. The user terminal of claim 20, wherein the second circuit provides the impedance to the input of the power amplifier at the third frequency that is greater than a second impedance presented to the input of the power amplifier at the first frequency range.

23. The user terminal of claim 20, wherein the first circuit comprises an in-band circuit.

24. The user terminal of claim 20, wherein the power amplifier includes:

a first power amplifier stage having a first input thereto and a first output therefrom; and a second power amplifier stage having a second input thereto that is electrically coupled to the first output, wherein the first signal is electrically coupled to the second input.

25. The user terminal of claim 20, wherein the first frequency range is about 824 MHz to 849 MHz and the second frequency range is about 869 MHz to 894 MHz.

26. The user terminal of claim 20, wherein the third frequency is about 45 MHz.

27. The user terminal of claim 20, wherein the third frequency is generated by the power amplifier.

28. A method for amplifying in a power amplifier in a user terminal, the power amplifier amplifying first signals for transmission from the user terminal in a first frequency range and the user terminal receiving second signals in a second frequency range, the method comprising the steps of:

conducting the first signals to an input of the power amplifier; and changing an impedance presented to the input of the power amplifier at a difference frequency that is a function of a difference between the first frequency range and the second frequency range.

29. The method of claim 28, wherein the step of changing comprises the step of:

presenting a first impedance to the first signals; and presenting a second impedance, less than the first impedance, to a third frequency at the input of the power amplifier, the third frequency being a function of the difference between the second frequency range and the first frequency range.

30. The method of claim 28, wherein the step of changing comprises the step of:

presenting a first impedance to the first signals; and presenting a second impedance, greater than the first impedance, to a third frequency at the input of the power amplifier, the third frequency being a function of the difference between the second frequency range and the first frequency range.

31. The method of claim 28, wherein the first frequency range is about 824 MHz to 849 MHz and the second frequency range is about 869 MHz to 894 MHz.

32. The method of claim 28, wherein the third frequency is about 45 MHz.

33. The method of claim 28, wherein the third frequency is generated by the power amplifier.

34. A power amplifier system in a user terminal, the power amplifier system amplifying first signals for transmission from the user terminal in a first frequency range and the user terminal receiving second signals in a second frequency range, the power amplifier system comprising:

means for conducting the first signals to an input of the power amplifier; and means for changing an impedance presented to the input of the power amplifier at a difference frequency that is a function of a difference between the first frequency range and the second frequency range.

35. The power amplifier system of claim 34, wherein the means for changing comprises:

means for presenting a first impedance to the first signals; and means for presenting a second impedance, less than the first impedance, to a third frequency at the input of the power amplifier, the third frequency being a function of the difference between the second frequency range and the first frequency range.

36. The power amplifier system of claim 34, wherein the means for changing comprises:

means for presenting a first impedance to the first signals; and means for presenting a second impedance, greater than the first impedance, to a third frequency at the input of the power amplifier, the third frequency being a function of the difference between the second frequency range and the first frequency range.

37. The power amplifier system of claim 34, wherein the first frequency range is about 824 MHz to 849 MHz and the second frequency range is about 869 MHz to 894 MHz.

38. The power amplifier system of claim 34, wherein the third frequency is about 45 MHz.

39. The power amplifier system of claim 34, wherein the third frequency is generated by the power amplifier.

40. The power amplifier system of claim 34, wherein the means for presenting the first impedance comprises an in-band circuit.

* * * * *